(12) United States Patent
Ye et al.

(10) Patent No.: US 9,599,483 B2
(45) Date of Patent: Mar. 21, 2017

(54) REGION GUIDED AND CHANGE TOLERANT FAST SHORTEST PATH ALGORITHM AND GRAPH PREPROCESSING FRAMEWORK

(71) Applicant: Futurewei Technologies, Inc., Plano, TX (US)

(72) Inventors: Feng Ye, Mississauga (CA); Chen Tian, Union City, CA (US); Liya Chen, San Jose, CA (US)

(73) Assignee: Futurewei Technologies, Inc., Plano, TX (US)

( * ) Notice: Subject to any disclaimer, the term of this patent is extended or adjusted under 35 U.S.C. 154(b) by 74 days.

(21) Appl. No.: 14/749,354

(22) Filed: Jun. 24, 2015

(65) Prior Publication Data

US 2016/0377442 A1    Dec. 29, 2016

(51) Int. Cl.
*G01C 21/34*    (2006.01)
*G06F 17/50*    (2006.01)
*H04L 12/733*   (2013.01)

(52) U.S. Cl.
CPC ....... *G01C 21/3446* (2013.01); *G06F 17/509* (2013.01); *G06F 17/5072* (2013.01); *H04L 45/122* (2013.01); *H04L 45/126* (2013.01)

(58) Field of Classification Search
None
See application file for complete search history.

(56) References Cited

U.S. PATENT DOCUMENTS

| | | | | |
|---|---|---|---|---|
| 7,610,367 | B2* | 10/2009 | Canright | H04L 41/12 709/223 |
| 2011/0299425 | A1* | 12/2011 | Kumar | H04L 29/12254 370/255 |
| 2013/0163983 | A1 | 6/2013 | Skoog | |
| 2013/0326494 | A1* | 12/2013 | Nunez | H04L 41/082 717/172 |

FOREIGN PATENT DOCUMENTS

CN    102201993 A    9/2011

OTHER PUBLICATIONS

Delling, D. et al., "Customizable Route Planning," Proceedings of the 10th International Conference on Experimental Algorithms, Sep. 11, 2011, Springer-Verlag. 12 pages.

(Continued)

*Primary Examiner* — Russell Frejd
(74) *Attorney, Agent, or Firm* — Slater Matsil, LLP

(57) ABSTRACT

A method for region guided and change tolerant fast shortest path determination and graph preprocessing for network management and control. In an embodiment, a method includes partitioning, by a network component, a plurality of network nodes into a plurality of regions, each network node belonging to one of the regions; identifying, by the network component, border nodes for each region, each border node in a region connecting to at least one border node in a connecting region; determining, by the network component, intervals between regions according to the border nodes, each interval comprising a minimum distance and a maximum distance between two regions; determining, by the network component, a path from a source node to a target node according to the intervals.

22 Claims, 7 Drawing Sheets

(56) References Cited

OTHER PUBLICATIONS

Efentakis, A. et al., "Optimizing Landmark-Based Routing and Reprocessing," 13th IWCTS, Orlando, FL, USA, Nov. 5-8, 2013, 6 pages.
Goldberg, A.V. et al., "Computing the Shortest Path: A* Search Meets Graph Theory," 16th ACM-SIAM Symposium on Discrete Algorithms, 2004, 10 pages.
Maue, J. et al., "Goal Directed Shortest Path Queries Using Pre-computed Cluster Distances," Journal of Experimental Algorithmics (JEA), vol. 14, 2009, Article 2, 12 pages.

* cited by examiner

400

|  | COLUMN 1 | COLUMN 2 | COLUMN 3 | COLUMN 4 | COLUMN 5 |
|---|---|---|---|---|---|
| ROW 1 | 0<br>6 | 20<br>40 | 78<br>99 | 100<br>272 | 876<br>1673 |
| ROW 2 | 20<br>40 | 0<br>5 | 25<br>35 | 17<br>34 | 70<br>156 |
| ROW 3 | 78<br>99 | 25<br>35 | 0<br>8 | 23<br>72 | 47<br>88 |
| ROW 4 | 100<br>272 | 17<br>34 | 23<br>72 | 0<br>4 | 18<br>27 |
| ROW 5 | 876<br>1673 | 70<br>156 | 47<br>88 | 18<br>27 | 0<br>6 |

REGION GUIDED AND CHANGE TOLERANT FAST SHORTEST PATH ALGORITHM AND GRAPH PREPROCESSING FRAMEWORK

TECHNICAL FIELD

The present invention relates generally to networks, and, in particular embodiments, to a system and method for communication network management and control, to a system and method for directions in a network of roads, to a system and method for social networking, and to a system and method for path determination in circuit networks.

BACKGROUND

Communication network management and services have been under tremendous transformation. With rapid development of Software-Defined Networking (SDN) and the Internet of Things (IoT), billions of new devices are required to be supported seamlessly and dynamically, and new services are thus imposing much more control and management duty than ever before. Path Computation Element (PCE) and survivability analysis in network routing are some examples of such services in which shortest path algorithms are at heart of the technology that maintains network robustness, flexibility, economics, and swift responses to demands (e.g., Service Level Agreements (SLAs)).

The classic shortest path issue has been long studied. Assume V the number of nodes, and E the number of edges, in graph G. The well-known Single-Pair Shortest Path (SPSP) algorithms include Dijkstra Algorithm ($O(V^{**}2)$), Bellman-Ford algorithm ($O(VE)$), and other variant algorithms (around $O(E+V^*\log(V))$). The Floyd-Warshall algorithm ($O(V^{**}3)$) computes all shortest paths for each pair of nodes in the graph. The major issue with the classic Shortest Path (SP) algorithms is that none of the classic algorithms are practically useful if used naively. In particular, it comes when G is a significant large graph (V is at millions or larger) and the completion of SPSP is within seconds. The typical uses of SPSP on large graphs are telecommunication networks, social networking, road networks, etc. Even for communication networks where the number of nodes may not be very large, the computation for SPSP from service provisioning, for example, is required to complete within milliseconds, which is effectively similar to the cases of large graphs. Hard requirements imposed by real world applications motivate seeking new solutions to speed up SPSP computation.

SUMMARY

In accordance with an embodiment of the present invention, a method in a network component for communication network management and control includes partitioning, by the network component, a plurality of network nodes into a plurality of regions, each network node belonging to one of the regions; identifying, by the network component, border nodes for each region, each border node in a region connecting to at least one border node in a connecting region; determining, by the network component, intervals between regions according to the border nodes, each interval comprising a minimum distance and a maximum distance between two regions; determining, by the network component, a path from a source node to a target node according to the intervals.

In accordance with another embodiment of the present invention, a network component configured for path determination includes a processor and a non-transitory computer readable storage medium storing programming for execution by the processor, the programming including instructions to: partition a plurality of network nodes into a plurality of regions, each network node belonging to one of the regions; identify border nodes for each region, each border node in a first region connecting to at least one border node in a second connecting region; determine intervals between regions according to the border nodes, each interval comprising a minimum distance and a maximum distance between border vertices for the two regions; determine a path from a source node to a target node according to the intervals.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
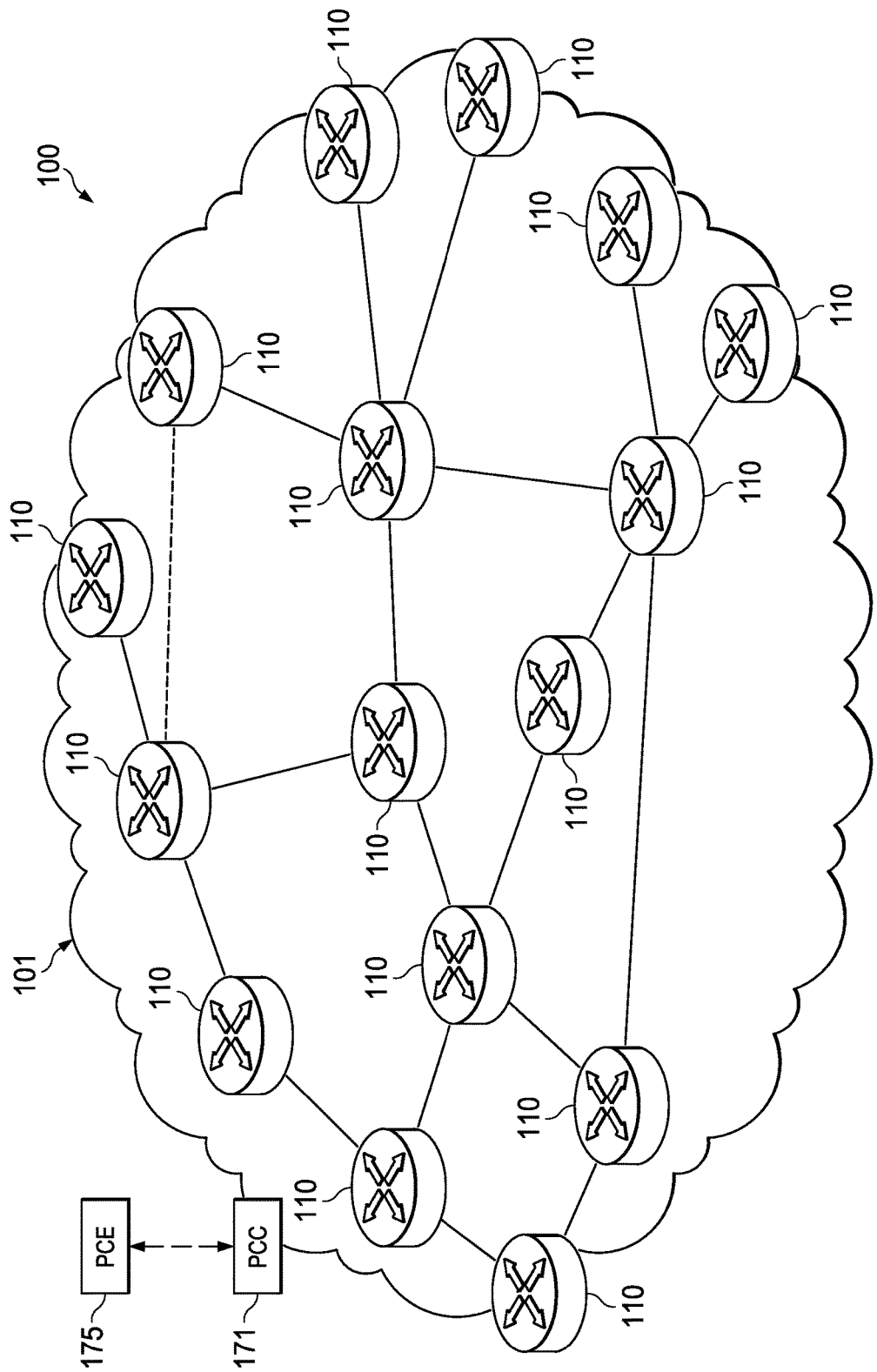
FIG. 1 illustrates one embodiment of a network in which the systems and methods of this disclosure may be implemented.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Parallelization of classic SP algorithms is one solution to tackle the practical issues. Single node multithreaded solutions can handle SPSP on relatively small graph. Massively multithreaded solutions achieve a certain successes by making use of Graphics Processing Unit (GPU) architecture that offers massive data parallelism capability. Pregel (Google) employs Bulk Synchronous Parallel (BSP) model to distribute graph nodes across distributed computing nodes. Thus computing nodes can share the overall work load at some expenses of communication and network management. Based on BSP Apache Gigraph utilizes Apache Hadoop platform to speed up the SPSP algorithm. Built on the Apache Spark platform GraphX further enjoys in-memory computation to achieve higher speedup especially on iterative graph algorithms. Paralleling SPSP and running the algorithms on a distributed system is definitely the mainstream currently. However all of the implementations do not reduce the amount of computation. The execution time of SPSP is still significant even though a large cluster is used.

Preprocessing is an alternative used in other approaches to speed up the SPSP algorithm. Some of these approaches use 2-phase processing. Phase 1 produces additional information about the graph; Phase 2 accelerates SPSP computation on the preprocessed graph with the additional information from Phase 1. Some alternative approaches direct the search towards targets by choosing certain path segments that belong to shortest paths and ignore the other segments that do not belong to the best paths according to the preprocessed information. Thus the search is guided by a kind of landmark/road sign, and as such the search space can be greatly reduced.

Customizable Route Planning (CRP) is another approach that partitions a graph into overlay subgraphs and a query is processed by making use of precomputed distances among subgraphs.

SPSP is at core of many real world applications. Take as example the specific Constraint Shortest Path Finding (CSPF), there are many real constraints and real time requirements. Network status (graph topology) is not constant. If a request for network resources is allocated, the commitment of the request will change the network's available resources for next request in addition to changes introduced by other factors. The time spending on CSPF must be within milliseconds. The dynamic nature of network topology and the requirement for fast response to query give a huge challenge to all existing SPSP algorithms. To speed up query, any unnecessary computation during query should be avoided by certain preprocessing.

Some existing approaches include a reach based SPSP algorithm, a landmark based algorithm, and a partition based algorithm. The reach based SPSP algorithm ALT[1] preprocesses graphs to produce a "reach" for each of vertex as an upper bound for all paths containing that vertex. During bidirectional search, the reach is used to prune search space. However, since his method is vertex based, the granularity is too low and not suitable for ever changing graphs.

The landmark based algorithm [2] uses triangle inequalities to preprocess distances of all vertices to a set of selected landmarks in order to reduce search space. The amount of computation for preprocessing is huge and if the graph changes, the entire preprocessing must be recomputed. However the idea on landmarks for pruning search speeds up significantly the response to queries.

The partition based algorithm [3] forms an H graph by having only boundary vertices of each cell and then bidirectional SPSP algorithm (Dijkstra) is applied. This method computes paths at higher level but does not any bounds to limit search space. Change tolerance is also not considered. The partition based algorithm [4] also precomputes bounds between cells and does bidirectional search while maintaining an upper bound estimate for each frontier. However there is no utilization of lower bounds between cells.

Disclosed herein are methods to tackle the issue from three aspects: Topology abstraction (graph partitioning), Target Region guided SPSP, and Topology abstraction updates.

Disclosed herein is a single pair (one source node to one destination node) shortest path (SPSP) system and method for a region guided and change tolerant fast shortest path algorithm and graph preprocessing framework. An embodiment is targeted at fast SPSP queries on large networks with unpredictable changes. Embodiments of the disclosed systems and methods systematically and dynamically handle the queries fast and efficiently to meet the real world requirement.

Disclosed is a two-pass and random N-seeding clustering algorithm. In an embodiment, the first pass, the random N-seeding merging, ensures that every vertex in a graph has fairly equal chance to be united with its closest neighbor to form a bigger community until N communities (regions) are formed. This process largely eliminates biased clustering methods that commonly exist with other methods. The second pass, rebalancing, further explores opportunities that improve occasional imbalanced clusters in extreme cases.

In an embodiment, with the aid of additional preprocessed information on partitions, the major SPSP computation is largely a high level topology which is composed of N larger vertices. The SPSP is guided by an interval of future path length which helps greatly eliminate large part of search space. Hence, a fast search is achieved.

In an embodiment, network updates are mostly locally under the disclosed framework. Since the search speed of embodiments of the disclosed systems and methods rely on distance preprocessing between border vertices on a subgraph, it is likely that a change on a link will not affect the distances. If there are changes, the change is often contained in a subgraph, which could lead to make a high level preprocessing unnecessary. Since the local re-preprocessing is on a subgraph, the amount of computation is thus reduced. If the local re-preprocessing is still considered unsatisfactory to practical requirements, the disclosed framework can hierarchically be applied to subgraphs again. Hence, the preprocessing on network update is still efficient.

Although described herein primarily with reference to communication networks, the systems and methods disclosed herein may also be applied to other types of maps and path computations, such as, for example, determining a route between cities on a map.

Disclosed herein is an embodiment of a method in a network component for path determination. The method includes partitioning, by the network component, a plurality of network nodes into a plurality of regions, each network node belonging to one of the regions; identifying, by the network component, border nodes for each region, each border node in a region connecting to at least one border node in a connecting region; determining, by the network component, intervals between regions according to the border nodes, each interval comprising a minimum distance and a maximum distance between border nodes for each pair of regions; determining, by the network component, a path from a source node to a target node according to the intervals. In an embodiment, the determined path is used to set up at least one network node. The method may also include re-determining intervals for one of the regions in response to a change to border nodes within the one of the regions. In an embodiment, determining the path from the source node to the target node according to the intervals includes eliminating search space according to the intervals. In an embodiment, the partitioning is a two pass process. A first pass includes grouping nodes such that each node has a substantially equal probability of being grouped with its closest neighbor. A second pass includes rebalancing the regions. In an embodiment, only a portion of the determined path is recalculated in response to a change in a link between nodes. In an embodiment, partitioning includes partitioning the nodes into a hierarchy of groups and subgroups, wherein at least one group comprises a plurality of subgroups, wherein each subgroup comprises a plurality of nodes. In an embodiment, the determined path includes a plurality of sub-paths, wherein only partial preprocessing information within a group or subgroup in which a changed node is located or among groups may be recalculated in response to the change. In an embodiment, the change includes a change in links to other nodes, a failure of a link to another node, an addition of a link to another node, and an addition of the node to the network. In an embodiment, the change includes a change to a drivability of a road, addition of a new road, and a change in speed limit on a road, and wherein the nodes are locations where at least two roads intersect.

Disclosed herein is a network component configured for path determination. In an embodiment, the network component includes a processor and a non-transitory computer readable storage medium storing programming for execution by the processor, the programming including instructions to: partition a plurality of network nodes into a plurality of regions, each network node belonging to one of the regions; identify border nodes for each region, each border node in a region connecting to at least one border node in a connecting region; determine intervals between regions according to the border nodes, each interval comprising a minimum distance and a maximum distance between border nodes for the two regions; determine a path from a source node to a target node according to the intervals.

FIG. 1 illustrates one embodiment of a network 100 in which the systems and methods of this disclosure may be implemented. The network 100 may include a plurality of nodes 110, a path computation element (PCE) 175, and a path computation client (PCC) 171. The nodes 110, the PCE 175, and the PCC 171 may communicate with each other through links (illustrated by solid lines). The links may be wired links (e.g., optical links, electrical links) or wireless links. The nodes 110 may be any network device capable of establishing connection with and communicating with other devices either wirelessly or via wired connections. In an embodiment, the PCE 175 and/or the PCC 171 may be co-located within one of the nodes 110. Network 100 may be a radio access network (RAN), a backhaul network, an internet backbone network, a combination of multiple types of networks, or any other type of communication network.

A path can be provided by the PCC 171 and/or the PCE 175. For example, the PCC 171 may request a path or route from the PCE 175, which computes the path and forwards the computed path information back to the PCC 171. The path can be a point-to-point (P2P) path, which may include a plurality of nodes and extends from a source node to a target node. The PCC 171 provides the path information or a subset of the path information to one or more nodes 110.

Figure 2:
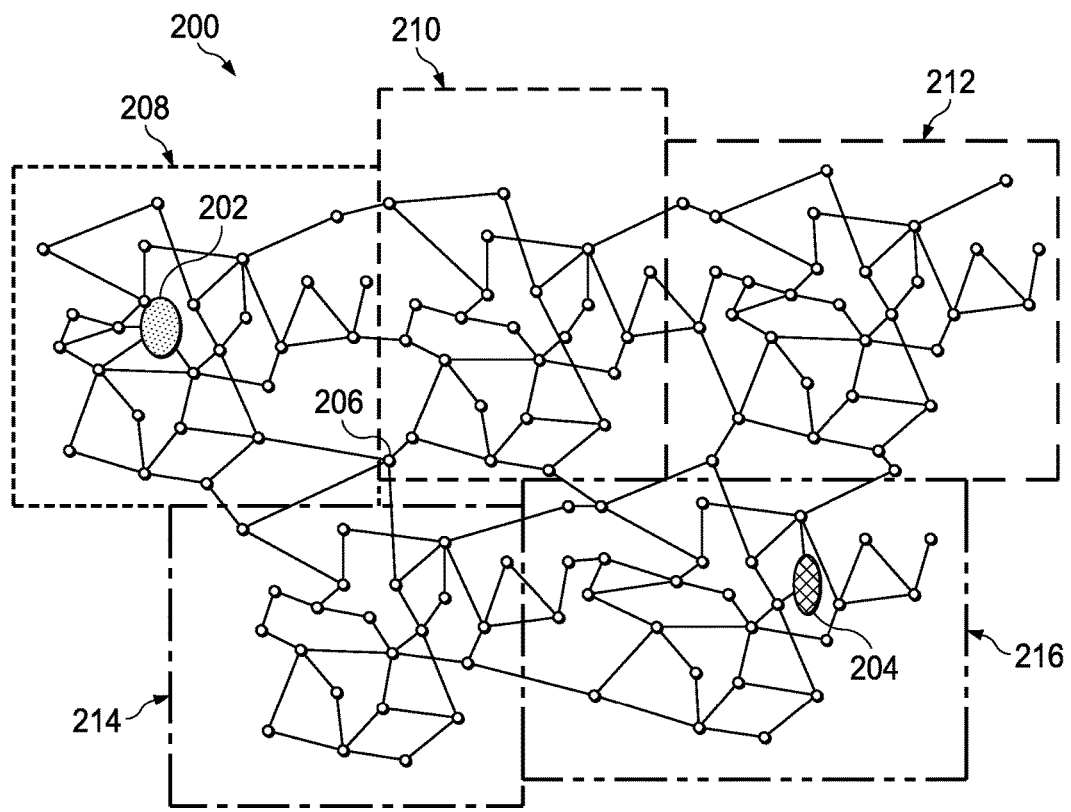
FIG. 2 is a graph of an embodiment system 200 of partitioning nodes in a network.

FIG. 2 is a graph of an embodiment system 200 of partitioning nodes in a network. System 200 includes a plurality of nodes 206 divides into a plurality of regions 208, 210, 212, 214, 216. The system 200 also includes a source node 202 and a target node 204. A shortest path between the source node 202 and target node 204 is desired. Some of the nodes (206 for instance) may be border nodes which are on the "edge" of a region 208, 210, 212, 214, 216 and connect with a border node of another region 208, 210, 212, 214, 216. In an embodiment, system 200 may be implemented as network 100 in FIG. 1. The nodes 202 may be, for example, any of nodes 110 in FIG. 1.

Although described primarily with reference to a telecommunication network, those of ordinary skill in the art will recognize that the disclosed systems and methods are not so limited, but may be applied to many other applications in which paths between segments of a network are computed. For example, the disclosed systems and methods may be applied to a road map to determine a shortest path between locations on the map. As another example, the disclosed systems and methods may be applied in a social networking context. As another example, the disclosed systems and methods may be applied to circuit networks to provide pathways between circuit elements. Those of ordinary skill in the art will recognize other applications of the disclosed systems and methods.

Typically, the term node is used in telecommunication applications and vertex is used in other mapping and networking contexts, but for purposes of this disclosure, the terms are used interchangeably. In an embodiment, a node or a vertex is an intersection in a network where two or more links intersect. In a telecommunication context, a node may be a network element having connections to other network elements. In a road map context, the node or vertex may be a point at which two or more roads intersect. In a social networking context in which each user profile represents a node and with "links" to other user profiles that are considered "friends" or that are in the "network" of a user.

The graph of system 200 is represented by G=(V,E), where V is a set of vertices, E a set of edges linking vertices. Without losing generality, assume G is connected and undirected. As humans, we intuitively recognize a short path from a map never by exhaustively searching, but rather by overlooking the source(s) and target (t) regions, then connecting intermediate regions along the line linking the regions s or t belongs to, and lastly choosing within a region routes with roughly correct direction leading to the target. To solve a complex problem one of methodology is divide-and-conquer that works by dividing the original problem into smaller ones (sub problems) and then conquering the smaller ones with which a solution to the original problem can be formed. SPSP is not an exception. A naïve search, whether it is Dijkstra's or Bellman-Ford's, leads to an exhaustive searching that is impractical in real world. Many studies have shown that a high level abstraction/partitioning of graph is vital to the efficiency of SPSP solutions. An embodiment follows the route of a high level graph abstraction, target region guided SPSP, and graph abstraction update.

I. Graph

Given N>0, V is N partitioned if $V=U_{i=1 \ to \ N} V_i$, $V_i \subset V$ and $V_i \cap V_j = \emptyset$ if $i \neq j$, $0 < i, j \leq N$. That is, the set V is partitioned into N disjoint subsets. A new graph G'=(V', E') can be constructed from G such that $V'=\{V_1, \ldots, V_n\}$, V' is an N-partition of V, and E'={all edges from E that link two clusters $V_i$ and $V_j$}. G' is considered as an N-partition based abstraction of G.

With an abstraction, G can be studied at a higher level for profile information like direction and key traffic harbors, etc. This is quite similar to overviewing a world map at a continent level. If one wants to travel from New York to London, one is unlikely to go to Rio de Janeiro then to London due to the fact that the direction is way off the direction to the target city. Having a right abstraction is the key to speedup SPSP. Abstraction can be achieved by various clustering algorithms. For SPSP, in an embodiment, it is desirable to have informational function that represents the overall closeness of a cluster. The goal is partition G into N parts where vertices in each part are closely connected. There are two basic attributes representing relationship between two vertices: connectivity and distance. However the connectivity can be implicitly represented by the distance ($e=\infty$ means the edge does not exist). Without loss of generality, assume G has at most N disconnected clusters in the following discussion. In the following, the terms region and cluster are used interchangeably.

A cluster is called a closure if the shortest path for any pair of vertices of a cluster does not fall outside of the cluster. The closeness of a closed $V_i$, denoted as closeness $(V_i)$, is measured as the sum of shortest distances of all pair of vertices within $V_i$. A special case is closeness $(V_i)=0$ if $V_i$ contains a single vertex. Given N>0, the clustering algorithm is as follows.

(0) initially, each vertex itself forms a cluster $V_i$
(1) Randomly select N clusters.
From each selected cluster, choose a neighbor cluster to merge, such that any shortest path between v and $v_i$ of $V_i$ does not fall outside of $V_i$.
(2) Repeat (1) until G is N partitioned or no more merge
(3) Check if there is a border vertex u from $V_j$ that can be merged into a connecting neighbor cluster $V_i$, such that the newly formed clusters $V_i \cup \{u\}$ and $(V_j-\{u\})$ are closed and closeness $(V_i \cup \{u\})$+closeness $(V_j-\{u\})$<closeness $(V_i)$+closeness $(V_j)$. If so, make the merge.
(4) Repeat (3) until no action can be taken or G is N partitioned The above clustering algorithm works on 2 phases: merging and rebalancing. First it forms larger closed clusters from smaller ones by merging closely connected neighbors. Second fine-tunes the N partitioned graph to make it even closer. Note that it is possible that G may not be exact N-partitioned with the clustering algorithm. However it does not fail the following region guided search algorithm since N is merely an empirical hint. Since the clustering step is done at preprocessing phase, the amount of computation is not a major concern.

Figure 3:
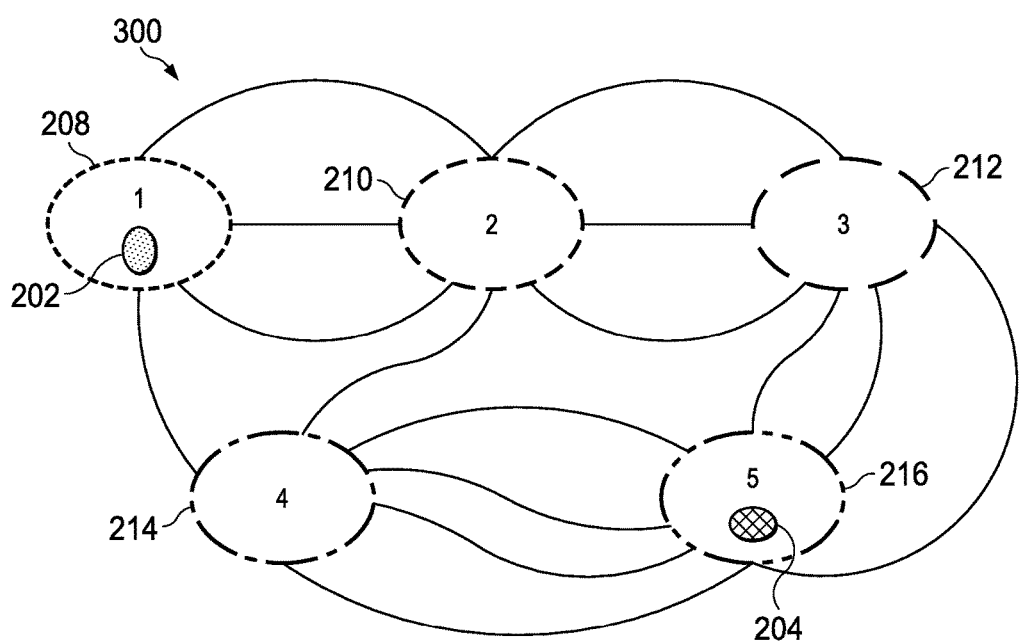
FIG. 3 is a graph of a high level view of the original graph shown in FIG. 2.

Through a clustering algorithm, a graph 300 shown in FIG. 3 of a high level view of the original graph 200 shown in FIG. 2 can be determined. SPSP algorithm can take advantage of a high level view by moving a large portion of computation into preprocessing. Graph 300 shows only each region 208, 210, 212, 214, 216 along with the source node 202 and the target node 204 along with the paths from the border nodes from each region 208, 210, 212, 214, 216 to the border nodes of other regions 208, 210, 212, 214, 216. The nodes within a region 208, 210, 212, 214, 216 are not shown.

II. Target Region Guided SPSP

Further preprocess to construct profile information for the partitioned graph G'. Assume G' is composed of N clusters.

To preprocess the graph, first do as described above in section I to partition G. Then compute the following matrices described as following. Compute distance matrices $B_{dist}$ for each pair of border vertices of a cluster.

$R_{dist}(V_k)$: Each matrix element $R_{dist}(V_k)(i,j)$ is the shortest distance between border vertex pair $v_i$ and $v_j$ of the region $V_k$.

Based on $R_{dist}$, compute distance matrices among clusters, $C_{min}$ and $C_{max}$, each of which is N×N matrix.

$C_{min}$: Each element $C_{min}(i,j)$ is the minimum shortest distance from a border vertex of $V_i$ to a border vertex of $V_j$ in G'. For simplicity, if vertices (u and v) are used in places of i and j in the following algorithm, $C_{min}(u,v)$ denotes similarly the minimum shortest distance between border vertices of clusters where vertices u and v belong to.

$C_{max}$: Each element $C_{max}(i,j)$ is the maximum shortest distance from a border vertex of $V_i$ to a border vertex of $V_j$ in G'. Other uses of $C_{max}$ is similar to $C_{min}$.

Assume the source vertex s is in $V_s$ and the target vertex t in $V_t$. A fast target region guided search algorithm is as follows:

```
(0)   If s and t are within same V_i, compute the shortest path from s to t with a shortest path
      algorithm denoted as distance(s, t) and exit
          Let len_low_t be the shortest distance from t to a border vertex of its region, and
      len_high_t the longest shortest path to border.
      Initialize queue Q and T
          Initialize each v in V: v.length = ∞
          s.length = 0
          lowerest_high = ∞
(1)   For each border vertex v of V_s do
          v.length = distance(s, v)
          exp_len_low = v.length + C_min (s, t) + len_low_t
          exp_len_high = v.length + C_max (s, t) + len_high_t
          Add (v, exp_len_low, exp_len_high) to T
          if exp_len_high < lowerest_high
              lowerest_high = len_high
(2)   Q = T
      Clear T
(3)   For each (v, len_low, len_high) in Q do
          Let V_i be the cluster for which v belongs to
          if len_low > lowerest_high
              continue
          if V_i is NOT V_t
              For each edge (v, u) linking V_i and V_j do
                  For each border vertex w of V_j do
                      next_len = v.length + edge (v, u) + R_dist (V_j) (u, w)
                      update = false
                      if w.length > next_len
                          w.length = next_len
                          update = true
```

-continued

```
            exp_len_low = next_len + C_min (j, t) + len_low_t
            exp_len_high = next_len + C_max (j, t) + len_high_t
            if exp_len_low <= lowerest_high
    lowerest_high = exp_len_high
            if update
                Add (w, exp_len_low, exp_len_high) into T
(4) Repeat (2)(3) until T is empty
(5) The shortest path from s to t = min{v.length + distance(v, t) | v is the border vertex of V_t
}
```

One of advantages of this disclosure is that, at any point of search expansion, only the paths within a length range will be considered. As such any search direction that deviates from the target will be penalized by a larger lower length bound. Therefore, the path range limited by the low and high bounds significantly reduces the search space, and with aid of the preprocessed information, the amount of computation for the algorithm is low.

Figures 4, 5:
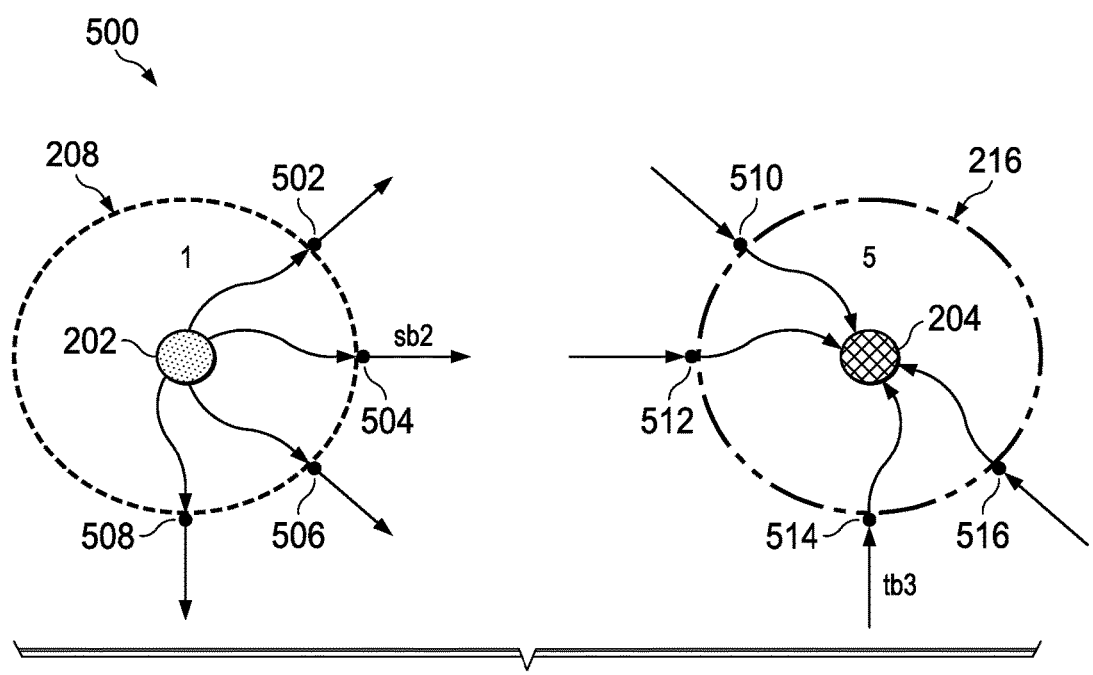
FIG. 4 is a graph of an embodiment of an interval matrix.
FIG. 5 is a graph that shows an embodiment system for computing which sbx has the potential to search further using the preprocessed interval matrix R for regions using a region guided search.

FIG. 4 is a graph of an embodiment of an interval matrix. Each cell includes two entries, $C_{min}$ and $C_{max}$. The top entry on each cell is $C_{min}$ and the bottom entry is $C_{max}$. $C_{min}$ is the minimum possible distance between border vertices between two regions and $C_{max}$ is the maximum possible distance between border vertices between two regions. The interval matrix 400 is symmetric about the diagonal with the entries on the diagonal being null or zero with $C_{min}$ since diagonal entries represent the distance between border vertices for the same region (e.g., between region 1 and region 1), which has necessarily zero for the minimum distance and other values for $C_{max}$. For example, col. 1, row 2 shows the minimum, $C_{min}=20$, and the maximum, $C_{max}=40$, distance between border vertices between region 1 and region 2. Col. 2, row 1 is the same as col. 1, row 2 as it represents the same two regions.

FIG. 5 is a graph that shows an embodiment system 500 for computing which sbx has the potential to search further using the preprocessed interval matrices $C_{min}$ and $C_{max}$ for regions using a region guided search. At any vertex that deviates from the shortest paths from the source region to the target region will be ignored at a very early stage. System 500 shows region 1 208 and region 5 216 from System 200. Each region includes one or more border vertices 502, 504, 506, 508, 510, 512, 514, 516. Region 1 208 also includes the source node 202 and region 5 216 includes the target node 204. Each source border vertex 502, 504, 506, 508 can be labeled as sbi, where i indicates which source region border node. Similarly, each target border vertex 510, 512, 514, 516 can be labeled tbj, where j indicates which target region border node. The search starts the source 202 towards the source region borders, sb1, sb2, sb3, and sb4. Similarly, search (with any search algorithm) from the target borders, tb1, tb2, tb3, and tb4, towards the target 204. Although shown with four border vertices for each of source region 208 and target region 216, those of ordinary skill in the art will recognize that the systems and methods disclosed herein are applicable to regions having any number of border vertices. Furthermore, those of ordinary skill in the art will recognize that the number of border vertices in different regions are not necessarily the same. Next, compute which sbx has the potential to search further using the preprocessed matrix R of distances between regions. Thus, at any point, it is known how far it is from the source, but also how far it is to the target. Therefore, the minimum and maximum lengths are given as follows:

Minimum path length at sbi: len(sbi)+$C_{min}$(1,5)+ len_low_t(t)

Maximum path length at sbi: len(sbi)+$C_{max}$(1,5)+ len_high_t(t)

where len_low_t(tbj) and len_high_t(tbj) are the minimum and maximum lengths of the shortest paths from the target vertex to the border vertices of its region.

In an embodiment, it can be assumed that sbi has a length range. Thus, any vertex with minimum length exceeds the current least upper limit of known ranges will be useless, and, therefore, ignored. Subsequent search iterations are similar to the initial source region.

Figure 6:
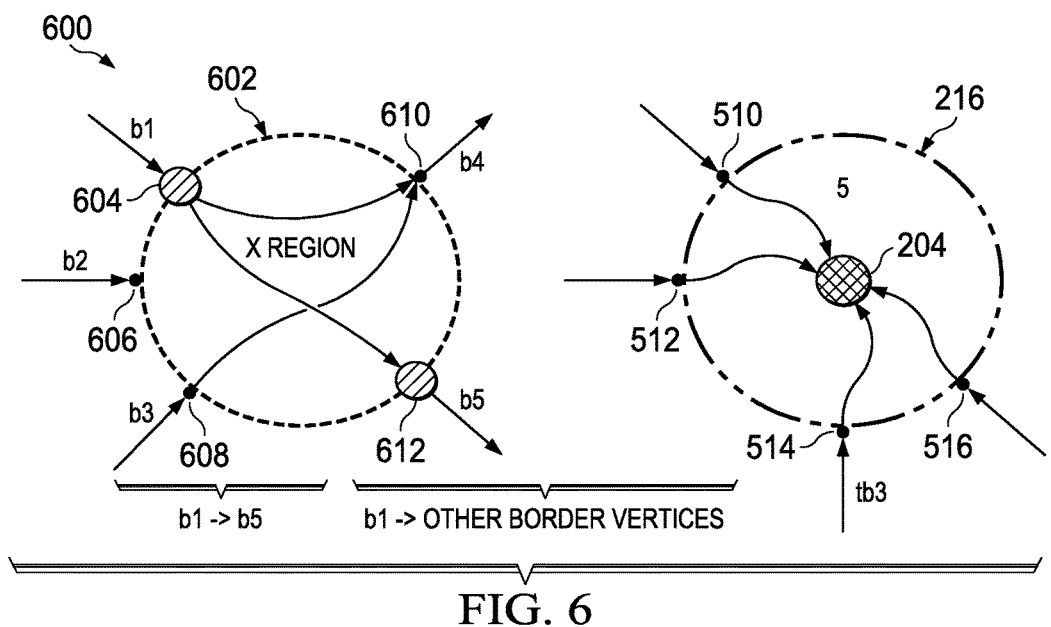
FIG. 6 is a graph illustrating an embodiment of a system for searching shortest paths for inner regions.

FIG. 6 is a graph illustrating an embodiment of a system 600 for searching shortest paths for inner regions. System 600 shows an inner region X 602 between the source region 208 and the target region 216. Target region 216 includes the target node 204. Region X 602 could be any of regions 210, 212, and 214 in FIG. 2. Region X 602 includes border vertices 604, 606, 608, 610, and 612 labeled b1, b2, b3, b4, and b5 respectively. For subsequent search iterations for inner regions, in an embodiment, it is only necessary to consider border vertices to the target region 216. Assume b1 is the vertex expanded from a link to the region X 612 for the search of this iteration. All border vertices (b1, b2, b3, b4, and b5) of the region X 612 will be checked for the possibility of being a candidate vertex in a potential shortest path. FIG. 6 illustrates only b5 is chosen for next search iteration while others are eliminated as candidates as their length ranges fall outside of the best range. Thus, a similar process is applied to inner region X 602 when considering to expand the border vertex bx to the other border vertex by on the same region:

Minimum at x region: len(bx)+$R_{dist}$(X)(bx,by)+$C_{min}$ (X,5)+len_low_t(t)

Maximum at x region: len(bx)+$R_{dist}$(X)(bx,by)+$C_{max}$ (X,5)+len_high_t(t)

Note that only border vertices are used in searching in the inner regions 210, 212, and 214 and that the distances among the border vertices are already preprocessed. Thus, there is no need to search within a region. Furthermore, candidate vertices can be fast eliminated at an early stage. By using preprocessed distances, the search is done at a high level and the interval values (i.e., ranges) efficiently prune the search space.

III. Topology Update and Graph Profiling Update

In the real world, specifically in telecommunication, networks are constantly changing. The change can happen even between two consecutive SPSP computations. Fast responses to SPSP are vital to maintain SLA. Thus a subsequent long preprocess update becomes unviable to the fast changing networks. Due to the disclosed interval based SPSP algorithm, the amount of computation required for the change to graph profiles is alleviated to a very small scale or even unnecessary in some cases. It has been observed that a roadmap or telecommunication network changes almost always happen at a few road segments or network links within a short period of time. This disclosure results in significant reduction of the amount of preprocessing computation required in response to the network changes.

Topology changes include: vertices/edges are removed or added, or the weights on edges are changed. To better describe the status of network and ease processing, the notations of removal of edges and the base graph are introduced.

Removal of an edge e is represented by setting e's weight to ∞ which can be a sufficiently large positive number in the disclosed framework.

A network change can be described by its corresponding graph changed from $G^1=(V^1,E^1)$ to $G^2=(V^2,E^2)$. During a time frame, the latest network status can be viewed as a series of graphs transformations starting from its initial graph: $G^o=(V^o,E^o)$, $G^1=(V^1,E^1)$ ... $G^+=(V^+, E^+)$. $G^o$ is called the base of $G^{+t}$.

Removal of an edge e corresponds to setting e to ∞ and e still exists in graph. Removal of a vertex v can be represented by setting all edges of v to ∞ and v still exists in graph. As such, all graph changes become the edge weight changes. The base graph is adequate to model real world networks as network nodes or links may change but it is rare that new nodes or links are unforeseeable in a reasonable time frame. It becomes clear that changes on very small portion of vertices or edges only lead to local changes under graph partition. For an N-partitioned graph, if the number of changes in a short time is far less than N, it will be highly likely that the changes happens within far fewer partitions. If two consecutive SPSP queries are apart in short time, very fewer changes or nothing would happen. Otherwise, if two consecutive SPSP queries are far apart in time, more changes may happen within that timeframe, an incremental approach to update the profile information can be adopted so that it allows one to do more work as more time is allowed. Confining changes within local scopes can make preprocessing a huge difference. The major computation is only at the very initial preprocessing on the base graph $G^o$.

Assume the base graph is $G^o=(V,E^o)$ preprocessed and partitioned to N regions. The algorithm for updating preprocessed information is as follows.

(1) Assume a graph change event happens
  The previous graph: $G^i=(V,E^i)$. $C_{max}^i$, $C_{min}^i$, and $R_{dist}^i$ are preprocessed
  The current graph: $G^{i+1}=(V,E^{i+1})$
    Compute $D=E^{i+1}-E^i \cap E^{i+1}$
    $D_{bridge}=\{e|e \in D, e$ is an edge connecting two regions$\}$
    $D_{inner}=D-D_{bridge}$
    high_level_compute=true if $D_{bridge}$ is not empty otherwise false
(2) For each $e \in D_{inner}$
  Mark the region in which e resides
(3) For each marked region in (2)
  Compute $R_{dist}^{i+1}$
  high_level_compute=true if $R_{dist}^{i+1} \neq R_{dist}^{i+1}$
(4) If high_level_compute=true
  Compute $C_{min}^{i+1}$ and $C_{max}^{i+1}$ The major computation in the preprocessing update is at the lower level for $R_{dist}^{i+1}$ if there is a change inside a region that is on a shortest path for a pair of border vertices, or potentially at high level for $C_{min}^{i+1}$ and $C_{max}^{i+1}$. Note that the computation for $R_{dist}^{i+1}$ is only for border vertices of a region, which requires significantly less computation. Even the high level $C_{min}^{i+1}$ and $C_{max}^{i+1}$ their computations is at O(N**3) where N is usually small. Moreover, if the changes are containable $R_{dist}^{i+1}=R_{dist}^{i+1}$, there will be no high level recomputation at all.

Figure 7:
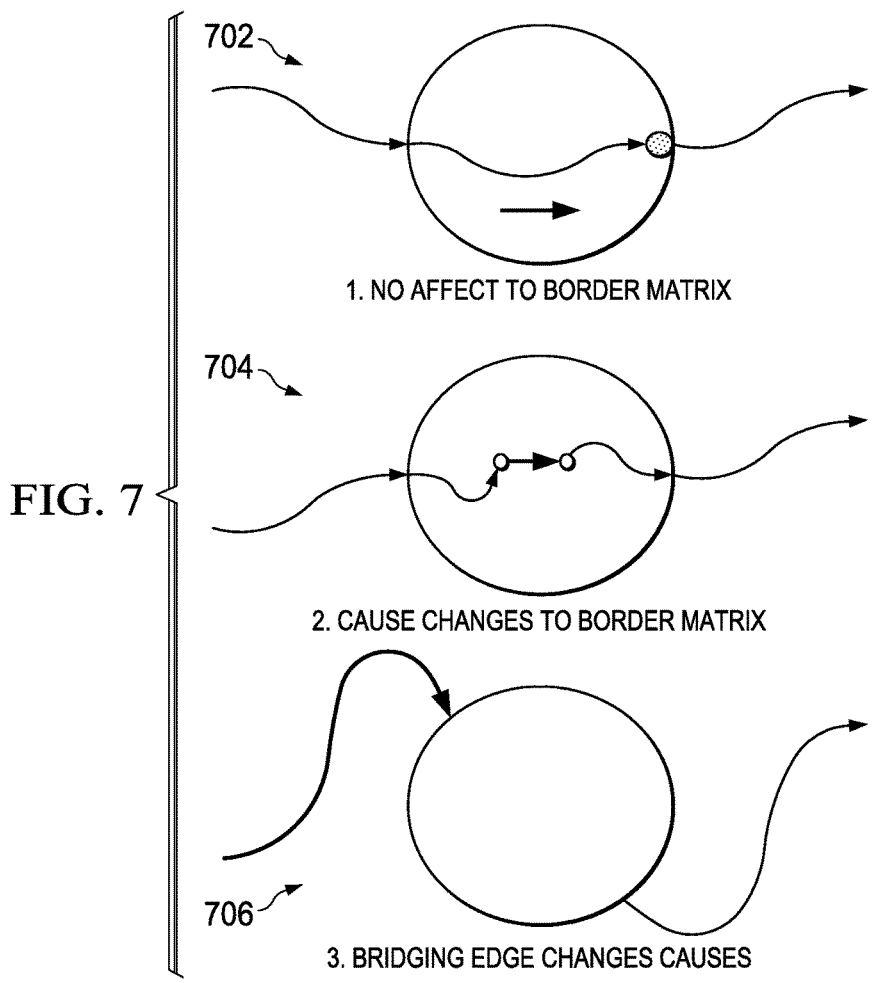
FIG. 7 is a block diagram illustrating examples of changes to the topology.

Examples of changes to the topology are illustrated in FIG. 7. In the first case 702, the change is containable. In the second case 704, which is the worst case scenario, only the cell and top matrices need to be re-computed in an embodiment. In the third case 706, only the top region matrix needs to be re-computed in an embodiment.

IV. Clustering Algorithm

Figure 8:
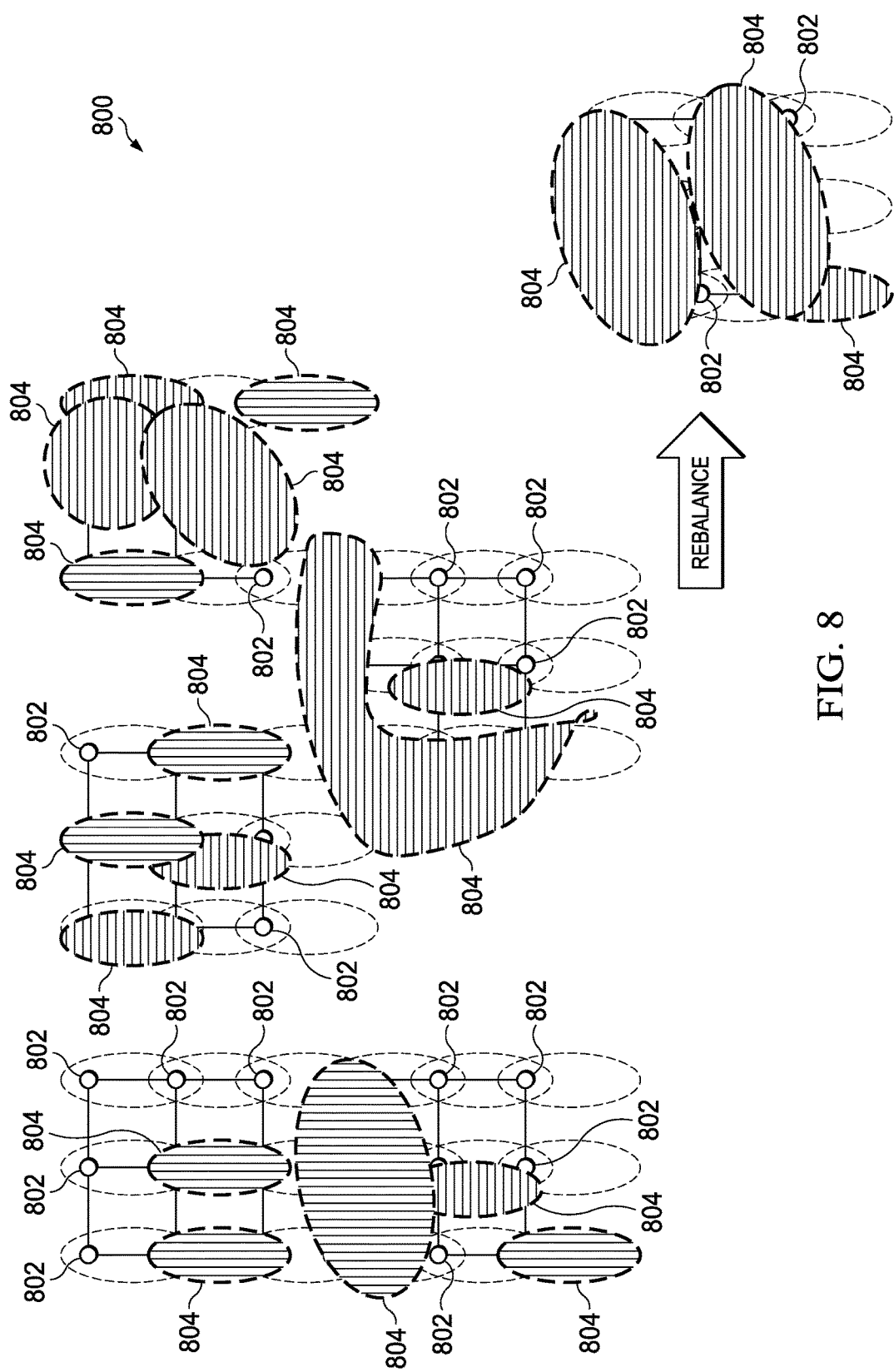
FIG. 8 is a graph illustrating an embodiment of a system for clustering nodes into regions.

FIG. 8 is a graph illustrating an embodiment of a system 800 for clustering nodes into regions. The system 800 includes nine nodes 802 and twelve edges with equal weight. The nine nodes 802 are grouped and regrouped through a process until N regions are formed. System 800 shows a six stage process of grouping, but other embodiments may include more or fewer stages until N regions are formed.

The clustering algorithm has two phases: region formation and region rebalance. Closure is used as a criterion to choose which neighbor to merge to form a larger region. Initially, each individual vertex 802 forms a region 804. Randomly choose two regions 804 as seeds marked with vertical hashing. The regions 804 marked with horizontal hashing are the results of the merge of the seeds from the previous iteration. The number of regions 804 to be formed, N, is given by input as the goal to partition the graph into N regions 804. In this embodiment it is 2. Next, two regions 804 are randomly selected to consider to merge with their direct neighbors. However, only ones in which the resulting region 804 forms a closure are chosen. This selection process is repeated until N regions 804 are formed or no more action can be taken. After forming the regions 804, a rebalance phase tries to "steal" a vertex from a neighbor region 804 to determine if the resulting region 804 is better based on the closeness heuristic function.

V. Preprocessing Based Graph Algorithm Framework

Figure 9:
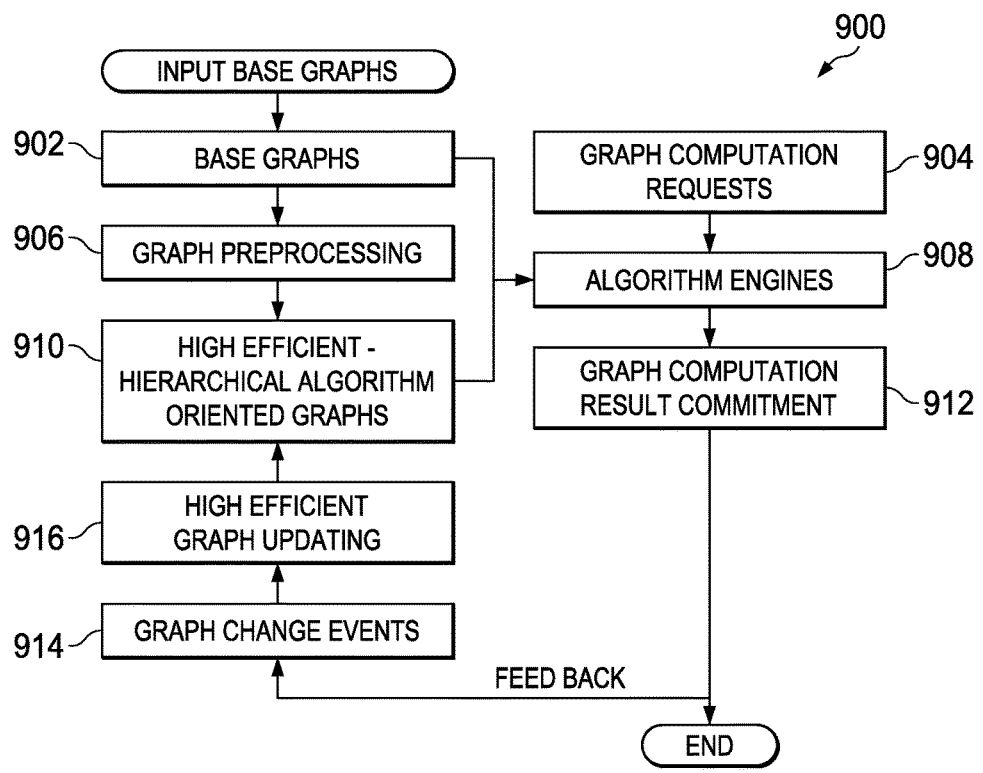
FIG. 9 is a block diagram of an embodiment of a system that demonstrates how graph algorithms can interact with each component to obtain fast shortest path determinations

Since using preprocessing graphs is usually always fast and cheap to many graph applications, in an embodiment, preprocessed graphs should be cached and synchronized with any changes associated with them. FIG. 9 is a block diagram of an embodiment of a system 900 that demonstrates how graph algorithms can interact with each component to obtain fast shortest path determinations. System 900 includes a base graphs component 902, a graph computation requests component 904, a graph preprocessing component 906, an algorithm engine component 908, a high efficient hierarchical algorithm oriented graphs component 910, a graph computation result commitment component 912, a graph change events component 914, and a high efficient graph updating component 916. The base graphs component 902 receives a base graph which the graph preprocessing component 906 then uses to calculate groupings of vertices and intervals between each pair of groups, and waits for a user's request from graph computation requests component 904. The graph preprocessing component 906 may also subgroup vertices within a group into subgroups and determine intervals between each pair of subgroups. The results of the preprocessing are submitted to the high-efficient hierarchical algorithm oriented graphs component 910 The graph computation requests component 904 receives a request for a path from a network device and submits the request to the algorithm engines component 908 which executes a target region guided SPSP algorithm, such as described above. Graph computation requests component 904 receives a user's request for a graph computation which is submitted to algorithm engine component 908. Algorithm engine component 908 is a driver which takes in the preprocessed graph from the high efficient hierarchical algorithm oriented graphs component 910 or the original graph from base graphs 902 and uses an appropriate graph algorithm to meet the requirement from graph computation requests component 904. The output from the algorithm engine component 908 is sent to the graph computation result commitment component 912 which presents the results to the user. Presenting the results to the user may be displaying a map to the user or may involve transmitting directions to another device. Graph change events component 914 receives the results from the graph computation result commitment component 912 and change events (e.g., a communication node is inoperable, a link between nodes is down (e.g., a road is closed or a telecommunication link is down)) and provides the changes and output from component 912 to high efficient graph updating component 916 which updates the graph and provides the update to high efficient hierarchical algorithm oriented graphs component 910.

Figure 10:
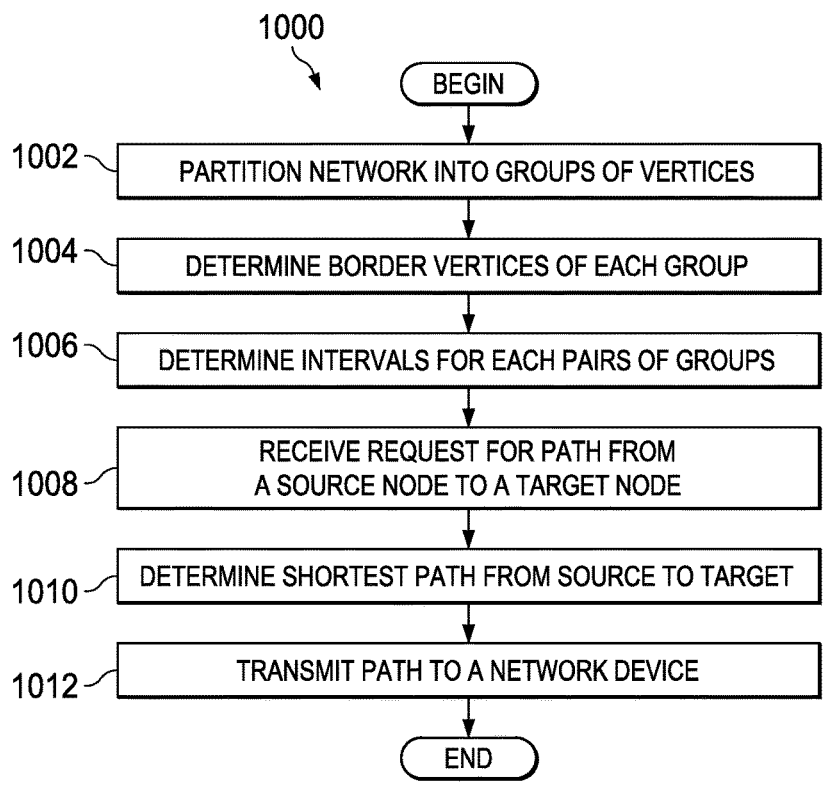
FIG. 10 is a flowchart of an embodiment of a method for determining a path across a network of nodes.

FIG. 10 is a flowchart of an embodiment of a method 1000 for determining a path across a network of vertices. The method 1000 begins at block 1002 where the network is partitioned into groups of vertices. In some embodiments one or more of the groups may also be subdivided into subgroups. Each subgroup may also be divided into further subgroups providing a hierarchical level of groupings. At block 1004, the border vertices of each group (or subgroup) are determined. At block 1006, the intervals for each pair of groups are determined where the intervals are the maximum possible path and minimum possible path from the border vertices of a first group to the border vertices of a second group for each pair of groups is determined. At block 1008, a request for a path from a source node to a target node is received. At block 1010, the shortest path from the source node to the target node is determined according to the maximum possible and minimum possible paths between the border vertices of the groups containing the source and target nodes, the possible paths from the source node to the border vertices of the source group, and the possible paths from the border vertices of the target group. At block 1012, the path is transmitted to a network device, after which, the method 1000 may end.

Figure 11:
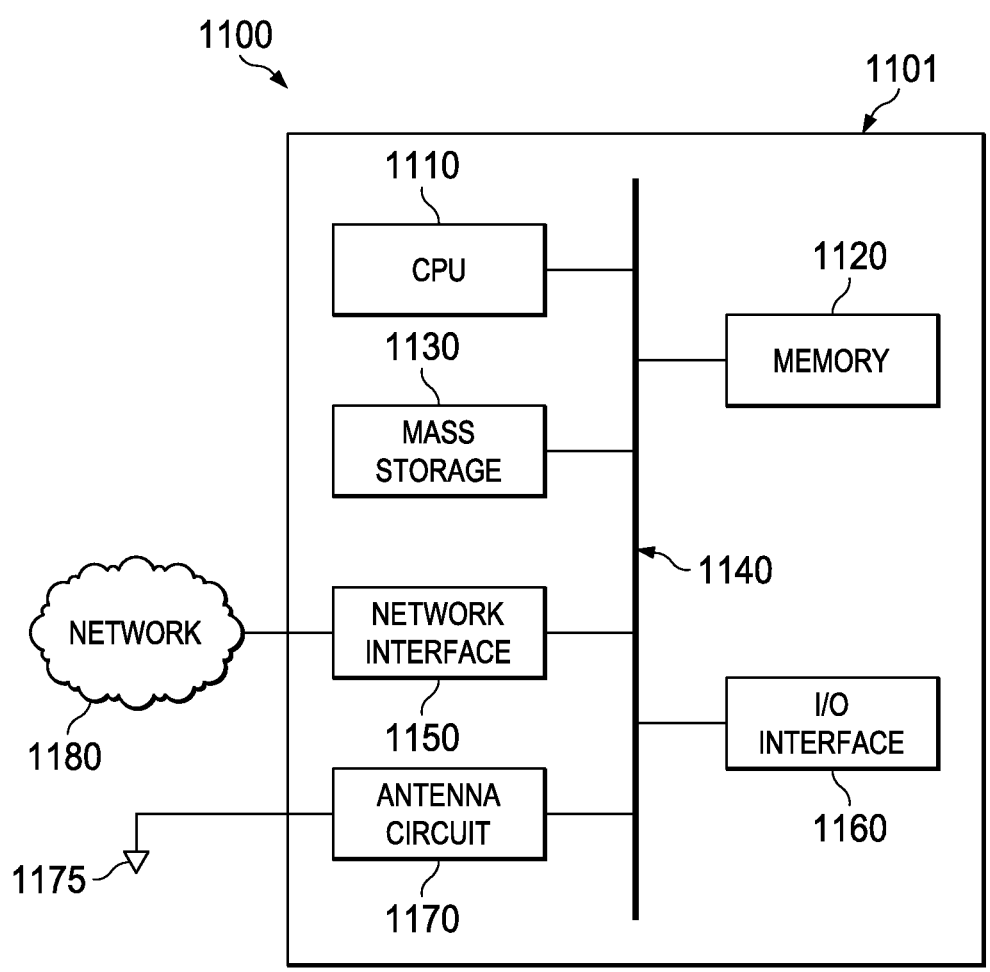
FIG. 11 is a block diagram of a processing system that may be used for implementing the devices and methods disclosed herein.

FIG. 11 is a block diagram of a processing system 1100 that may be used for implementing the devices and methods disclosed herein. Specific devices may utilize all of the components shown, or only a subset of the components and levels of integration may vary from device to device. Furthermore, a device may contain multiple instances of a component, such as multiple processing units, processors, memories, transmitters, receivers, etc. The processing system 1100 may comprise a processing unit 1101 equipped with one or more input/output devices, such as a speaker, microphone, mouse, touchscreen, keypad, keyboard, printer, display, and the like. The processing unit 1101 may include a central processing unit (CPU) 1110, memory 1120, a mass storage device 1130, a network interface 1150, an I/O interface 1160, and an antenna circuit 1170 connected to a bus 1140. The processing unit 1101 also includes an antenna element 1175 connected to the antenna circuit.

The bus 1140 may be one or more of any type of several bus architectures including a memory bus or memory controller, a peripheral bus, video bus, or the like. The CPU 1110 may comprise any type of electronic data processor. The memory 1120 may comprise any type of system memory such as static random access memory (SRAM), dynamic random access memory (DRAM), synchronous DRAM (SDRAM), read-only memory (ROM), a combination thereof, or the like. In an embodiment, the memory 1120 may include ROM for use at boot-up, and DRAM for program and data storage for use while executing programs.

The mass storage device 1130 may comprise any type of storage device configured to store data, programs, and other information and to make the data, programs, and other information accessible via the bus 1140. The mass storage device 1130 may comprise, for example, one or more of a solid state drive, hard disk drive, a magnetic disk drive, an optical disk drive, or the like.

The mass storage device 1130 and the memory 1120 may be non-transitory computer readable media.

The I/O interface 1160 may provide interfaces to couple external input and output devices to the processing unit 1101. The I/O interface 1160 may include a video adapter. Examples of input and output devices may include a display coupled to the video adapter and a mouse/keyboard/printer coupled to the I/O interface. Other devices may be coupled to the processing unit 1101 and additional or fewer interface cards may be utilized. For example, a serial interface such as Universal Serial Bus (USB) (not shown) may be used to provide an interface for a printer.

The antenna circuit 1170 and antenna element 1175 may allow the processing unit 1101 to communicate with remote units via a network. In an embodiment, the antenna circuit 1170 and antenna element 1175 provide access to a wireless wide area network (WAN) and/or to a cellular network, such as Long Term Evolution (LTE), Code Division Multiple Access (CDMA), Wideband CDMA (WCDMA), and Global System for Mobile Communications (GSM) networks. In some embodiments, the antenna circuit 1170 and antenna element 1175 may also provide Bluetooth and/or WiFi connection to other devices.

The processing unit 1101 may also include one or more network interfaces 1150, which may comprise wired links, such as an Ethernet cable or the like, and/or wireless links to access nodes or different networks. The network interface 1101 allows the processing unit 1101 to communicate with remote units via the networks 1180. For example, the network interface 1150 may provide wireless communication via one or more transmitters/transmit antennas and one or more receivers/receive antennas. In an embodiment, the processing unit 1101 is coupled to a local-area network or a wide-area network for data processing and communications with remote devices, such as other processing units, the Internet, remote storage facilities, or the like.

The following references are related to subject matter of the present application. Each of these references is incorporated herein by reference in its entirety:

[1] A. V. Goldberg and C. Harrelson. Computing the shortest path: A* search meets graph theory. In 16th ACM-SIAM Symposium on Discrete Algorithms, pages 156-165, 2004.

[2] A. Efentakis and D. Pfoser. Optimizing Landmark-Based Routing and Preprocessing. In 13th IWCTS, November, 2013, Orlando, Fla., USA

[3] D. Delling, A. V. Goldberg, T. Pajor, and R. F. Werneck. Customizable route planning. In Proceedings of the 10th international conference on Experimental algorithms, SEA'11, pages 376-387, Berlin, Heidelberg, 2011. Springer-Verlag.

[4] J. Maue, P. Sanders, and D. Matijevic. Goal-Directed Shortest-Path Queries Using Precomputed Cluster Distances. ACM JEA 14:3.2:1-3.2:27, 2009.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method in a network component for path determination, comprising:
    partitioning, by the network component, a plurality of network nodes into a plurality of regions, each network node belonging to one of the regions;
    identifying, by the network component, border nodes for each region, each border node in a region connecting to at least one border node in a connecting region;
    determining, by the network component, intervals between regions according to the border nodes, each interval comprising a minimum distance and a maximum distance between border nodes for each pair of regions; and
    determining, by the network component, a path from a source node to a target node according to the intervals.

2. The method of claim 1, further comprising re-determining intervals for one of the regions in response to a change to border nodes within the one of the regions.

3. The method of claim 1, wherein determining the path from the source node to the target node according to the intervals comprises eliminating search space according to the intervals.

4. The method of claim 1, wherein the partitioning comprises a two pass process.

5. The method of claim 4, wherein a first pass comprises grouping nodes such that each node has a substantially equal probability of being grouped with its closest neighbor.

6. The method of claim 4, wherein a second pass comprises rebalancing the regions.

7. The method of claim 1, wherein only a portion of the determined path is recalculated in response to a change in a link between nodes.

8. The method of claim 1, wherein partitioning comprises partitioning the nodes into a hierarchy of groups and subgroups, wherein at least one group comprises a plurality of subgroups, wherein each subgroup comprises a plurality of nodes.

9. The method of claim 1, wherein the determined path comprises a plurality of sub-paths, wherein only a sub-path within a group or subgroup in which a changed node is located is recalculated in response to the change.

10. The method of claim 9, wherein the change comprises one of a change in links to other nodes, a failure of a link to another node, an addition of a link to another node, and an addition of the node to the network.

11. The method of claim 9, wherein the change comprises one of a change to a drivability of a road, addition of a new road, and a change in speed limit on a road, and wherein the nodes are locations where at least two roads intersect.

12. A network component configured for path determination, comprising:
    a processor; and
    a non-transitory computer readable storage medium storing programming for execution by the processor, the programming including instructions to:
        partition a plurality of network nodes into a plurality of regions, each network node belonging to one of the regions;
        identify border nodes for each region, each border node in a region connecting to at least one border node in a connecting region;
        determine intervals between regions according to the border nodes, each interval comprising a minimum distance and a maximum distance between border nodes for each pair of regions; and
        determine a path from a source node to a target node according to the intervals.

13. The network component of claim 12, wherein the programming further comprises instructions to re-determine intervals for one of the regions in response to a change to border nodes within the one of the regions.

14. The network component of claim 12, wherein the instructions to determine the path from the source node to the target node according to the intervals comprises eliminating search space according to the intervals.

15. The network component of claim 12, wherein the instructions to partition comprises a two pass process.

16. The network component of claim 15, wherein a first pass comprises grouping nodes such that each node has a substantially equal probability of being grouped with its closest neighbor.

17. The network component of claim 15, wherein a second pass comprises rebalancing the regions.

18. The network component of claim 12, wherein only a portion of the determined path is recalculated in response to a change in a link between nodes.

19. The network component of claim 12, wherein the instructions to partition comprises instructions to partition the nodes into a hierarchy of groups and subgroups, wherein at least one group comprises a plurality of subgroups, wherein each subgroup comprises a plurality of nodes.

20. The network component of claim 12, wherein the determined path comprises a plurality of sub-paths, wherein only a sub-path within a group or subgroup in which a changed node is located is recalculated in response to the change.

21. The network component of claim 20, wherein the change comprises one of a change in links to other nodes, a failure of a link to another node, an addition of a link to another vertex, and an addition of the node to the network.

22. The network component of claim 20, wherein the change comprises one of a change to a drivability of a road, addition of a new road, and a change in speed limit on a road, and wherein the nodes are locations where at least two roads intersect.

* * * * *